(12) United States Patent
McElwain

(10) Patent No.: US 7,920,651 B2
(45) Date of Patent: Apr. 5, 2011

(54) JOINT SYMBOL, AMPLITUDE, AND RATE ESTIMATOR

(75) Inventor: Thomas P McElwain, Merrimack, NH (US)

(73) Assignee: BAE Systems Information and Electronics Systems Integration Inc., Nashua, NH (US)

( * ) Notice: Subject to any disclaimer, the term of this patent is extended or adjusted under 35 U.S.C. 154(b) by 21 days.

(21) Appl. No.: 12/491,332

(22) Filed: Jun. 25, 2009

(65) Prior Publication Data

US 2009/0290667 A1 Nov. 26, 2009

Related U.S. Application Data

(62) Division of application No. 12/251,575, filed on Oct. 15, 2008, now Pat. No. 7,583,757, which is a division of application No. 10/531,772, filed as application No. PCT/US03/38190 on Nov. 25, 2003, now Pat. No. 7,463,703.

(60) Provisional application No. 60/462,657, filed on Apr. 14, 2003.

(51) Int. Cl.
 *H03D 1/24* (2006.01)
(52) U.S. Cl. .......................... 375/320; 375/316
(58) Field of Classification Search .................. 375/320, 375/341, 316
 See application file for complete search history.

(56) References Cited

U.S. PATENT DOCUMENTS

| | | | |
|---|---|---|---|
| 6,023,783 A | 2/2000 | Divsalar et al. | |
| 6,298,461 B1 | 10/2001 | Tong et al. | |
| 6,373,858 B1 | 4/2002 | Soleimani et al. | |
| 6,397,367 B1 | 5/2002 | Park et al. | |
| 6,473,417 B1 | 10/2002 | Herzog | |
| 6,510,536 B1 | 1/2003 | Crozier et al. | |
| 6,574,291 B2 | 6/2003 | Doetsch et al. | |
| 6,956,893 B2 | 10/2005 | Frank et al. | |
| 7,110,439 B2 | 9/2006 | MacLeod | |
| 7,136,428 B2 | 11/2006 | Corbaton et al. | |
| 7,218,665 B2 | 5/2007 | McElwain | |
| 7,218,690 B2 | 5/2007 | Learned | |
| 2002/0110206 A1 | 8/2002 | Becker et al. | |
| 2002/0122464 A1 | 9/2002 | Dodge | |
| 2003/0031237 A1 | 2/2003 | Bachl et al. | |
| 2003/0074191 A1 | 4/2003 | Byrnes et al. | |
| 2003/0086512 A1 | 5/2003 | Rick et al. | |
| 2003/0102905 A1 | 6/2003 | Ha et al. | |
| 2003/0125937 A1 | 7/2003 | Thomson | |
| 2003/0128836 A1 | 7/2003 | Stephens et al. | |
| 2003/0138054 A1 | 7/2003 | Ha et al. | |
| 2003/0179698 A1 | 9/2003 | Lu | |
| 2003/0189979 A1 | 10/2003 | Li et al. | |

OTHER PUBLICATIONS

PCT Search Report dated Apr. 5, 2006 of Patent Application No. PCT/US03/38190 filed Nov. 25, 2003.
PCT Search Report dated Sep. 8, 2003 of Patent Application No. PCT/US03/15503 filed May 14, 2003.

(Continued)

*Primary Examiner* — Temesghen Ghebretinsae
(74) *Attorney, Agent, or Firm* — Vern Maine & Associates; Andrew P. Cernota; Daniel J. Long

(57) ABSTRACT

The system in one embodiment relates to tightly integrating parameter estimation, symbol hypothesis testing, decoding, and rate identification. The present invention provides Turbo-decoding for joint signal demodulation based on an iterative decoding solution that exploits error correction codes. The system iteratively couples an initial amplitude estimator, a symbol estimator, a bank of decoders, and a joint amplitude estimator to produce the symbol estimates.

8 Claims, 6 Drawing Sheets

OTHER PUBLICATIONS

Wei et al., "Synchronous DS-SSMA System with Improved Decorrelating Decision-Feedback Multiuser Detection", IEEE Transactions on Vehicular Technology, Aug. 1994, pp. 767-772, vol. 43, No. 3.

Duel-Hallen, Alexandria, "Decorrelating Decision-Feedback Multiuser Detector for Synchronous Code-Division Multiple-Access Channel", IEEE Transactions on Communications, Feb. 1993, pp. 285-290, vol. 41, No. 2.

Varanasi et al., "Near-Optimum Detection in Synchronous Code-Division Multiple-Access Systems", IEEE Transactions on Communications, May 1991, pp. 725-736, vol. 39, No. 5.

Lupas, R. et al., "Near-Far Resistance of Multiuser Detectors in Asynchronous Channels", IEEE Transactions on Communications, Apr. 1990, pp. 496-508, vol. 38, No. 4.

Lupas, R. et al., "Linear Multiuser Detectors for Synchronous Code-Division Multiple-Access Channels", IEEE Transactions on Information Theory, Jan. 1989, pp. 123-136, vol. 35, No. 1.

Verdu, Sergio, "Minimum Probability of Error for Asynchronous Gaussian Multiple-Access Channels", IEEE Transactions on Information Theory, Jan. 1986, pp. 95-96, vol. IT-32, No. 1.

Chan, A. et al., "A Class of Asymptotically Optimum Iterated-Decision Multiuser Detectors", May 2001, pp. 1-4.

Alexander, P. et al., "Iterative Multiuser Interference Reduction: Turbo CDMA", IEEE Transactions on Communications, Jul. 1999, pp. 1008-1014, vol. 47, No. 7.

Poor, H. Vincent, "Turbo Multiuser Detection: an Overview", IEEE 6th Int. Symp. on Spread-Spectrum Tech. & Appl., Sep. 2000, pp. 583-587.

Wang, X. et al., "Iterative (Turbo) Soft Interference Cancellation and Decoding for Coded CDMA", IEEE Transactions on Communications, Jul. 1999, pp. 1046-1061, vol. 47, No. 7.

Das, S. et al., "Computationally Efficient Iterative Multiuser Detection and Decoding", IEEE, 1998, pp. 631-635.

Herzog, R. et al, "Iterative Decoding and Despreading Improves CDMA-Systems Using M-ary Orthogonal Modulation and FEC", IEEE, 1997, pp. 909-913.

Wang, D. et al., "Low-Complexity MAP Decoding for Turbo Codes", IEEE, 2000, pp. 1035-1039.

Berrou, C. et al., "Near Shannon Limit Error—Correcting Coding and Decoding: Turbo-Codes (1)", IEEE, 1993, pp. 1064-1070.

Berrou, C. et al., "Near Optimum Error Correcting Coding and Decoding: Turbo-Codes", IEEE Transactions on Communications, Oct. 1996, pp. 1261-1271, vol. 44, No. 10.

Robertson, P. et al., "A Comparison of Optimal and Sub-Optimal MAP Decoding Algorithms Operating in the Log Domain", IEEE, 1995, pp. 1009-1013.

Hagenauer, J. et al., "A Viterbi Algorithm with Soft-Decision Outputs and its Applications", IEEE, 1989, pp. 1680-1686.

Pottie, G. et al., "A Comparison of Reduced Complexity Decoding Algorithms for Trellis Codes", IEEE Journal on Selected Areas in Communications, Dec. 1989, pp. 1369-1380, vol. 7, No. 9.

JOINT SYMBOL, AMPLITUDE, AND RATE ESTIMATOR

RELATED APPLICATIONS

This application is a divisional of U.S. patent application Ser. No. 12/251,575, filed Oct. 15, 2008, which is a divisional of U.S. patent application Ser. No. 10/531,772, filed Apr. 19, 2008, which is a U.S. National Phase Application of PCT Application No. PCT/US2003/038190, filed Nov. 25, 2003, which claims the benefit of U.S. Provisional Application No. 60/462,657, filed Apr. 14, 2003. This application is also related to U.S. patent application Ser. No. 10/105,918, filed Mar. 25, 2002 entitled "System for Decreasing Processing Time in an Iterative Multi-User Detector System"; U.S. patent application Ser. No. 10/414,738 filed Apr. 16, 2003 entitled "System and Method for Increasing Throughput in a Multiuser Detection Based Multiple Access Communications System"; U.S. patent application Ser. No. 10/208,409 entitled "Power and Confidence Ordered Low Complexity Soft TurboMUD with Voting System"; and U.S. patent application Ser. No. 12/251,571, filed Oct. 15, 2008 entitled "JOINT SYMBOL, AMPLITURE, AND RATE ESTIMATOR". Each of these applications is herein incorporated in their entirety by reference.

FIELD OF THE INVENTION

The present invention relates to communications and more particularly to co-channel communications, and more particularly to increasing capacity by allowing interfering channels.

BACKGROUND OF THE INVENTION

The telecommunications industry has been expanding at an unprecedented growth rate throughout the World. In particular, the wireless sector, including cell phones, PCS, wireless local area networks and Bluetooth such as IS95, GSM, 3G, IEEE 802.11a/b/g, and 802.16 has grown far beyond expectations and at a much higher rate than the fixed telecommunications (wired) counterpart. The ability to access data and communicate anywhere at anytime has enormous potential and commercial value.

The content of the wireless sector is also changing, with more and more data being transmitted, including Internet connectivity and live feeds. The usage involving personal digital assistants (PDA's) and even smart appliances have created new markets utilizing wireless data communications. Despite advancements in wireless transmission and reception, there is a growing problem of extracting more information signals within a limited bandwidth.

Emerging multiple-access receiver processing procedures allow for multiple users to access the same communications medium to transmit or receive information. Multiple access communication systems allow the transmission of multiple digital data streams between multiple transmitting and receiving devices. However, since many users transmit energy on the same communications channel, a number of inherent difficulties arise, particularly when receivers attempt to detect the information associated with a particular user when there is heavy signal interference created by other users of the system at the same time. Typically the signal of interest cannot be received or the quality of reception is significantly degraded.

For example, a base station that processes a number of cellular devices has to receive and transmit data within a certain frequency range. The ability to extract the correct data from a given user is a difficult task when the effects of interference and multipaths are considered. The problem is further complicated when the number of users exceeds the number of dimensions (e.g. time slots, frequency slots, polarizations, etc), resulting in an overloaded condition.

In addition to the problems associated with multiple users in a given bandwidth, an additional problem is the inability to process the data in the receivers in real time. Advanced receiver techniques cover several areas, namely interference suppression (also called Multi-User Detection or MUD), multipath combining and space-time processing, equalization, and channel estimation. These various techniques can be mixed and matched depending upon the circumstances.

One way of alleviating some of the multiple access problems is to separate the interfering transmissions at the receiver using signal processing techniques. However, state of the art receivers are not capable of detecting and decoding the information associated with each user under conditions of heavy interference. Another solution to the co-channel interference problem is to decrease the number of users per channel. This, of course, is not an attractive option for telecommunication companies, since obtaining the maximum number of users or managing peak volume transmission periods are important business objectives.

It should be understood that the discussion herein illustrates wireless cellular communications the multiple access topologies are equally applicable to wired cable systems and local area networks, read/write operations of a disc drive, satellite communications and any application that benefits from extracting digital information from among many multiple interfering signals.

Several techniques are used to improve results in co-channel multiple access communications systems. Frequency-Division Multiple Access (FDMA) assigns a different frequency to each user and parses an allocated band for a communication system wherein a single user's signal transmission power is concentrated into a single narrower radio frequency band. Interference from adjacent channels is limited by the use of band pass filters, however for each channel being assigned a different frequency system the total capacity is limited by the available frequency slots and by physical limitations imposed by frequency reuse. In a cellular telephone configuration this poses problems because all proximate cells must operate on different frequencies. However, frequency bands may be re-used, provided that the same frequency cells are positioned at a certain distance apart. A further drawback with FDMA schemes is that users will pay full-time for their assigned frequency regardless of their actual use of the system.

Code Division Multiple Access (CDMA) is another multiplexing technique wherein for each communication channel the signals are encoded using a sequence known to the transmitter and the receiver for that specific channel. In CDMA, all users use the same frequency at the same time. However, before transmission, the signal from each user is multiplied by a distinct signature waveform. The signature waveform is a signal that has a larger bandwidth than the information-bearing signal from the user. However, in a CDMA system, the total level of co-channel interference limits the number of active users at any instant of time.

In Time Division Multiple Access (TDMA) technology, multiple channels of data are temporally interleaved, i.e. each signal is assigned to a different time interval and the signals are transmitted individually, according to their assigned time slot. The TDMA channel consists of a time slot or frame in a periodic train of time intervals over the same frequency, with a given signal's energy confined to one of these time slots. However, in a TDMA system, all transmitters and receivers must have access to a common clock, as time-synchronization among the users is required. Adjacent channel interference is limited by the use of a time gate or other synchronization element that only passes signal energy received at the proper time. The system capacity is limited by the available time slots (within a given frequency band) as well as by physical limitations imposed by frequency reuse, as each channel is assigned a different time slot within a particular frequency band.

One of the goals of FDMA and TDMA systems is to try and prevent two potentially interfering signals from occupying the same frequency at the same time. In contrast, Code Division Multiple Access (CDMA) techniques allow signals to overlap in both time and frequency. CDMA signals share the same frequency spectrum at the same time, hence, the CDMA signals appear to overlap one another. The scrambled signal format of CDMA virtually eliminates cross talk between interfering transmitters.

In a CDMA system, each signal is transmitted using spread spectrum techniques. The transmitted informational data stream is impressed upon a much higher rate data stream termed a signature sequence. The bit stream of the signature sequence data is typically binary, and can be generated using a pseudo-noise (PN) process that appears random, but can be replicated by an authorized receiver. The informational data stream and the high bit rate signature sequence stream are combined by multiplying the two bit streams together, assuming the binary values of the two bit streams are represented by +1 or −1. This combination of the higher bit rate signal with the lower bit rate data stream is called spreading the informational data stream signal. Each informational data stream or channel is allocated a unique signature sequence.

In operation, a stream of spread information signature signals are modulated by weights corresponding to the information that is to be transmitted. Some modulation examples include binary phase shift keying (BPSK) and quadrature phase shift keying (QPSK). If several transmitters modulate their data onto the signature waveform and modulate again with the carrier tone, a radio frequency (RF) signal comprised of a continuous stream of information modulated signature pulses will be present at the receiver, one corresponding to each transmitter. The plurality of transmitted signals and are jointly received as a composite signal at the receiver. Each of the spread signals overlaps all of the other spread signals in time and frequency. Moreover, environmental noise as well as receiver electronic noise is also present in the measured received signal. The state of the art receiver correlates the composite noisy signal with one of the unique signature sequences, and the corresponding information signal is isolated and despread while the other signals appear as only small additions to the noise floor.

A signature sequence is often used to represent one bit of information. Receiving the transmitted sequence or its complement indicates whether the information bit is a +1 or −1, sometimes denoted "0" or "1". The signature sequence usually comprises N pulses, and each pulse is called a "chip". The entire N-chip sequence, or its complement, depending on the information bit to be conveyed, is referred to as a transmitted symbol.

The receiver correlates the received signal with the complex conjugate of the known signature sequence to produce a correlation value. When a 'large' positive correlation results, a "0" is detected, and when a 'large' negative correlation results, a "1" is detected.

It should be understood that the information bits could also be coded bits, where the code is a block or convolutional code. Also, the signature sequence can be much longer than a single transmitted symbol, in which case a subsequence of the signature sequence is used to spread the information bit.

The prior systems do not properly account for the real world mobile communication signals that suffer from signal degradation such as interference and multipath problems. The systems of the state of the art generally tended to make assumptions that all other interferers and multipaths were additive white Gaussian noise. However, this assumption is not accurate for co-channel interference and multipaths.

Multipath dispersion occurs when a signal proceeds to the receiver along not one but many paths so that the receiver encounters echoes having different and randomly varying delays and amplitudes. The receiver receives a composite signal of multiple versions of the transmitted symbol that have propagated along different paths, called rays, having different relative time. Each distinguishable ray has a certain relative time of arrival, a certain amplitude and phase, and as a result, the correlator outputs several smaller spikes. RAKE receivers are well known and attempt to 'rake' together all the contributions to detect the transmitted symbol and recover the information bit.

Conventional RAKE receivers provide satisfactory performance for operation in the presence of multipath under ideal conditions however the signature sequence must be uncorrelated with time shifted versions of itself as well as various shifted versions of the signature sequences of the other CDMA signals. Co-channel interference refers to signals received from other users either directly or reflected. If one received signal corresponding to the signature sequence of interest has a non-negligible cross correlation with the received signal originating from another transmitter (a co-channel interferer), then the value measured at the receiver, e.g. the correlation value for the signal of interest, is corrupted. In other words, the correlation computed at the receiver that would be used to decode a particular signal of interest is overwhelmed by an interfering signal; this is referred to as the near-far problem. The interference caused by an echo of one transmitted symbol overlapping with the next transmitted symbol might also be non-negligible. If this is the case, the transmitted symbols interfere with past and future transmitted symbols. This is commonly referred to as intersymbol interference (ISI). In actuality, performance is degraded both by co-channel interference and ISI.

There has been much research to address signal interference with known multipath time dispersion. This is termed joint demodulation with no multipath and is further described in S. Verdu, "Minimum Probability of Error For Asynchronous Gaussian Multiple-Access Channels," IEEE Trans. Info. Theory, Vol. IT-32, pp. 85-96, R. Lupas and S. Verdu, "Linear multiuser detectors for synchronous code-division multiple-access channels," IEEE Trans. Inform. Theory, Vol. 35, pp. 123-136, January 1989; and R. Lupas and S. Verdu, "Near-far resistance of multiuser detectors in asynchronous channels," IEEE Trans. Commun., Vol. 38, pp. 496-508, April 1990.

There are a host of approaches for jointly demodulating any set of interfering digitally modulated signals, including multiple digitally modulated signals. Maximum Likelihood Sequence Estimation determines the most likely set of transmitted information bits for a plurality of digital signals without multipath time dispersion. The maximum likelihood joint demodulator is capable, in theory, of accommodating the largest number of interfering signals, but has a prohibitive computational complexity that makes it unrealizable in practice. The decorrelation receiver is another, less computationally complex receiver processing approach that zeroes out or decorrelates the different signals so that they no longer interfere with one another. The decorrelator as well as virtually every other lower complexity joint demodulator, is not capable of operation when the number of signals is over a set threshold which falls significantly short of the theoretical maximum.

In a real world multi-user system, there are a number of independent users simultaneously transmitting signals. These transmissions have the real-time problems of multi-path and co-channel interference, fading, and dispersion that affect the received signals. As described in the prior art, multiple user systems communicate on the same frequency and at the same time by utilizing parameter and channel estimates that are processed by a multi-user detector. The output of the optimal multi-user detector operating within the multiuser capacity limits of the channel is an accurate estimation as to the individual bits for an individual user.

Moreover, in an article by Paul D. Alexander, Mark C. Reed, John A. Asenstorfer and Christian B. Schlagel in IEEE Transactions on Communications, vol. 47, number 7, July 1999, entitled "Iterative Multi-User Interference Reduction: Turbo CDMA," a system is described in which multiple users can transmit coded information on the same frequency at the same time, with the multi-user detection system separating the scrambled result into interference-free voice or data streams.

Low complexity multiuser detector have been contemplated that use linear multiuser detectors to achieve optimal near-far resistance. (Near-Far Resistance of Multiuser Detectors for Coherent Multiuser Communications, R. Lupas, S. Verdu, IEEE Trans. Commun. Vol. 38, no. 4, pp 495-508, April 1990). While providing certain advantages, the performance has not been demonstrably improved. Varanasi and Aazhang proposed a multistage technique as described in the article Near-Optimum Detection in Synchronous Code-Division Multiple Access Systems, IEEE Trans. Commun., Vol. 39, No. 5, May 1991.

Decorrelating decision feedback detectors (DDFD) have been described by A. Duel-Hallen in Decorrelating Decision-Feedback Multiuser Detector for Synchronous Code-division Multiple Access Channel, IEEE Trans. Commun., Vol. 41, pp 285-290, February 1993. Wei and Schlegel proposed soft-decision feedback to suppress error propagation of the DDFD in Synchronous DS-SSMA with Improved Decorrelating Decision-Feedback Multiuser Detection, IEEE Trans. Veh. Technol., Vol. 43, pp 767-772, August 1994. Tree-type maximum-likelihood sequence detectors were also proposed for multiuser systems as were breadth-first algorithms and sequential detection including using the M-algorithm tree-search scheme with a matched filter (MF). The prior references also reveal schemes that include some form of decorrelating noise whitening filter (WF).

However, one of the primary disadvantages of the prior references implementations is the inability to accommodate overloaded conditions. Decision feedback techniques are limited in that they are incapable of working in supersaturated environments. Although the MMSE-based decision feedback detector can work in a supersaturated environment, it has been demonstrated to be too aggressive with hypothesis testing to produce accurate results.

Multi-user detection (MUD) refers to the detection of data in non-orthogonal multiplexes. MUD processing increases the number of bits available per chip or signaling dimension for systems having interference limited systems. A MUD receiver jointly demodulates co-channel interfering digital signals. Multiuser detection systems take full advantage of all information available at the receiver, by making use of any "knowledge" that the receiver has about the interfering signals. Because the number of users that can be packed into a MUD-based multiple access (MA) system is a function of the number of independent dimensions over which the set of signals is spread (the dimension of the span of the set of signals), the total number of users in the system can be increased if more dimensions are used for transmitting the signals and the same dimensions are accessible at the receiver.

In addition to expanding the number of dimensions, favorably "spreading" the received signals out over those dimensions can also allow for increases in the number of users a MUD-based system can accommodate. For example, typical signaling sets for multiuser communications do not include as a free parameter the reference amplitude of each user. In the IS95 code division protocol, amplitude is controlled completely for purposes of power control to meet a signal-to-noise specification (all users ideally being received with the same signal-to-noise ratio (SNR)). Therefore the advantages offered to the MUD are not exploited and the aggregate throughput of a multiple access system is limited if amplitude is not exploited.

There are various multiuser detectors in the art, including optimal or maximum likelihood MUD, maximum likelihood sequence estimator for multiple interfering users, successive interference cancellation, TurboMUD or iterative MUD, and various linear algebra based multi-user detectors such as all of those detailed in the well-known text "Multiuser Detection" by Sergio Verdu. In the state of the art, algebraic means are used to compute linear operators for the entire set of users (communications channels) simultaneously. This is done by utilizing prior information, or knowledge of the likely value of each user's bit of information, each at a particular instant in time. This multiuser detection processing is described in the text S. Verdu, Multiuser Detection, Cambridge Press, 1998. However, this suffers from a significant disadvantage in that it requires knowledge of all parameters to perform the processing.

Optimal MUD based on the maximum likelihood sequence estimator operates by comparing the received signal with the entire number of possibilities that could have resulted, one for each bit or symbol epoch. The number of possible measured levels for the received signal is exponentially related to the number of users and the duration of the ISI. Hence, the optimal processing is a computationally complex and it is not possible to accomplish in a real-time environment. Thus for those multi-user detectors that examine the entire space, real-time operation is often elusive.

In general, optimal MUD units function by examining a number of possibilities for each bit. However, for multi-user detectors that examine a larger capacity of signal, the computations are complex and time-consuming, thus making real-time operation impossible. Numerous attempts at reliable pruning of the optimal MUD decision process or the use of linear approximation to the replace the optimal MUD have still not produced a workable solution for the real world environment.

There are several suboptimal multiuser detectors that are less computationally complex and known in the art. One example of suboptimal detectors, called linear detectors, includes decorrelators, minimum mean square error or MMSE detectors, and zero-forcing block linear equalizers. The conventional Minimum Mean Squared Error (MMSE) Multiuser detector utilizing prior information is described by Wang and Poor in "Iterative (Turbo) Soft Interference Cancellation and Decoding for Coded CDMA", in the Transactions on Communications, July 1999. See also Alexander, Reed, Asenstorfer, and Schlegel, "Iterative Multiuser Interference Reduction: Turbo CDMA," IEEE Trans on Comm, July 1999; and Poor, "Turbo Multiuser Detection: An Overview" ISSSTA 2000. But, linear algebra based MUD (non-iterative) and successive interference cancellation fails for cases of overloaded multiple access systems.

One example of overloading is where the number of simultaneous users is doubled or tripled relative to existing state of the art. Even for underloaded multiple access systems, the performance of non-iterative MUD and successive interference cancellation degrades significantly as the number of users increases, while the computation complexity of the optimal MUD increases significantly as the number of users increases. The computing problems are so extreme that even the most expensive hardware unbound by size and weight can often to keep us with this overwhelming complex processing requirement of optimal MUD. Moreover, an unreasonable delay would be required to decode each bit or symbol rendering such a system useless in practice.

Reduced complexity approaches based on tree-pruning help to some extent to eliminate the improper bit combination from consideration where, ideally, such a procedure should prune out many 'bad' paths in the decision tree but maintain the proper path. Thus, the entire tree does not need to be traversed to make the final decision.

The M-algorithm is a pruning process that limits the number of hypotheses extended to each stage to a fixed tree width and prunes based on ranking metrics for all hypotheses and retaining only the M most likely hypotheses. The T-algorithm prunes hypotheses by comparing the metrics representing all active hypotheses to a threshold based on the metric corresponding to the most-likely candidate. Performance of M-algorithm based MUD degrades as the parameter M is decreased, but M governs the number of computations required. Similar effects are seen for other tree-pruning based MUD (T-algorithm, etc). To combat improper pruning, basic tree-pruning must ensure that M is "large enough", and therefore still encounters increased complexity for acceptable performance levels when the number of interfering signals and/or ISI lengths are moderate to large.

As an illustration of the M-algorithm as a tree-pruning algorithm, consider a tree made up of nodes and branches. Each branch has a weight or metric, and a complete path is sequences of nodes connected by branches between the root of the tree and its branches. When applied as a short cut to the optimal MUD, each branch weight is a function of the signature signal of a certain transmitter, the possible bit or symbol value associated with that transmitter at that point in time, and the actual received signal which includes all the signals from all the interfering transmissions. The weight of each path is the sum of the branch metrics in a complete path. The goal of a tree searching algorithm is to try to find the complete path through a tree with the lowest metric. With the present invention the metrics of multiple complete paths are not calculated. Rather, the metrics of individual branches in a tree are calculated in the process of locating one complete path through the tree and thereby defines one unknown characteristic of each of the co-channel, interfering signals needed to decode the signals.

A MUD algorithm within the TurboMUD system determines discrete estimates of the transmitted channel symbols, with the estimates then provided to a bank of single-user decoders (one decoder for each user) to recover the input bit streams of all transmitted signals. Two general types of multi-user detectors within the TurboMUD system are possible, namely those that provide hard outputs, which are discrete values, and those that provide soft outputs, which indicate both the discrete estimate and the probability that the estimate is correct. In basic terms, turbodecoding refers to breaking a large processing process into smaller pieces and performing iterative processing on the smaller pieces until the larger processing is completed, and this basic principle was applied to the MUD.

However, single-user decoders operating on hard values, or discrete integers, have unacceptable error rates when there is a large amount of interference or noise in the received signal. The reason is that discrete integers do not provide adequate confidence values on which the single-user decoder can operate. These decoders operate better on so-called soft inputs in which confidence values can range from −1 to 1, such as for instance 0.75 as opposed to being either −1 or +1. To provide soft values that can then be utilized by a single-user decoder, the multi-user detector chosen for the TurboMUD can generate these soft values. The invention described below will work with soft output or a hard output MUDs, or a combination of the two.

In general, soft or hard output versions of the optimum maximum likelihood multi-user detector (Verdu, Multiuser Detection, Cambridge University Press, 1998) or an M algorithm (as described, for instance, in Schlegel, Trellis Coding, IEEE Press, 1997) with a moderate to high value of M causes the Turbo MUD to require too many computations to keep up with real time transmissions. Using a fast, but inferior, multiuser detection scheme such as a linear-based detector or those detailed in the text "Multiuser Detection" by Sergio Verdu causes poor quality output when there are many interferers or users.

Moreover, when dealing with hand-held communications units such as wireless handsets, the amount of processing within the device is limited, directly limiting the amount of computational complexity that is allowed. In order to provide real-time performance both at a cell site and the handset, it therefore becomes important to be able to reduce the amount of computational complexity and processing time so as to achieve real-time performance.

A great number of communications and data transfer systems operate at or near a full capacity. Conventional receiver performance is unsatisfactory in the presence of co-channel interference. Furthermore, many receivers require prior knowledge of signal parameters such as phase and amplitude of the channel to perform processing functions without co-channel interference. What is needed is a means to increase the number of available channels, by reassigning channels to be perhaps slightly interfering, thereby increasing the overall throughput without increasing bandwidth. Such a system should provide an efficient means of jointly estimating symbols, channel amplitude, and data rate transmitted in a super-saturated communications channel. And, any such invention should have the ability to estimate the symbols and data rate, blindly without prior knowledge of channel amplitudes and phase.

BRIEF SUMMARY OF THE INVENTION

While adaptable in many forms, one embodiment of the invention is an apparatus for processing a digital data stream from multiple users, comprising an initial amplitude estimation unit processing the data stream and producing initial amplitude estimates on a first iteration. There is a joint amplitude estimator coupled to the data stream and the initial amplitude estimator, wherein the joint amplitude estimator produces updated amplitude estimates. A symbol estimator is coupled to the data stream, the initial amplitude estimator, and the joint amplitude estimator, wherein the symbol estimator produces a plurality of symbols estimates for each user. There is a bank of decoders coupled to the symbol estimator, producing a plurality of symbol likelihood estimates for each user, wherein the symbol likelihood estimates are iteratively fed back to the symbol estimator and the joint amplitude estimator until a final condition is obtained.

Further variations of the invention include wherein the final condition is selected from at least one of the group consisting of: bit error rate metric level and fixed number of iterations.

The symbol hypothesis testing module can generally be any module that is a member selected from at least one of the group consisting Minimum Mean Squared Error (MMSE), maximum likelihood, M-algorithm, T-algorithm, and Q-algorithm, decorrelating decision-feedback detector (DDFD), improved decorrelating decision-feedback detector (ID-DFD), successive interference cancellation (SIC), parallel interference cancellation (PIC) and multi-stage detector; block-iterative interference cancellation; and a deferred decorrelating decision-feedback detector.

The apparatus can further comprise an energy detector coupled to the joint amplitude estimator which can determine activity on a channel, such as code, time slot or frequency channel.

The bank of decoders can be selected from at least one decoder of the group consisting of: Soft-output Viterbi, Maximum A Posteriori, and BCJR.

Another embodiment includes a method for providing initial amplitude estimation for a plurality of user channels, comprising separating the user channels into active channels and inactive channels. Processing the inactive channels is according to the sub-steps comprising applying a bank of filters to the inactive channels for each inactive user, squaring an output from the filters, summing an output from the squaring operation, and calculating an average bias estimate from an output of the summing. Processing the active channels is according to the sub-steps comprising applying a bank of filters to the user data of the active channels, squaring an output from the bank of filters, summing an output from the squaring, and removing the average bias estimate from an output from the summing.

The method can include processing the inactive channels by dividing the inactive channels into groups and calculating at least one group average bias estimate. It can also include processing the active channels by dividing the active channels into groups and respectively removing the at least one group average bias estimate.

A further variation includes scaling by the summers and may include an energy detector for separating the active channel from the inactive channels.

Another embodiment of the invention is an apparatus for processing initial amplitude estimates from a data stream of multiple users, comprising an energy detector measuring an energy level of the data stream, wherein the energy detector separates a plurality of active channels from a plurality of inactive channels. There is a bank of filters coupled to the inactive channels, a bank of squaring operators coupled to the bank of filters, a bank of inactive summers coupled to the squaring operators, and an average bias estimator coupled to the inactive summers calculating an average bias estimate. There is also a bank of filters coupled to the active channels, a bank of squaring operators coupled to the bank of filters, a bank of active summers coupled to the squaring operators, and a bias removal section coupled to the active summers and the average bias estimator.

Another embodiment includes a joint amplitude estimator for a data stream from multiple users, comprising a data stream from the multiple users divided into a plurality of observation intervals. There are a plurality of processing modules coupled to the observation intervals, wherein the processing modules calculates interference cancellation values for each of the users and computes a filter for each of the observation intervals. The filter being applied to the data within the observation interval is used to compute individual amplitude estimates. There is an amplitude estimation unit that processes the individual amplitude estimates and calculates new amplitude estimates, wherein the new amplitude estimates are iteratively passed back to the processing modules until a final condition is obtained.

One aspect includes where the amplitude estimation unit sums and weighs the individual estimates such that the new amplitude estimate is a weighted average of individual amplitude estimates.

It should be understood that the observation intervals may be based on distinguishing attributes selected from at least one of the group consisting of: time, code, and frequency.

The filter may be calculated for an arbitrary observation interval m by the equation:

$$G_m = B_m S_m^H (S_m \chi_m S_m^H + \sigma_n^2 I)^{-1}.$$

Yet a further embodiment includes a method for processing amplitude estimates for a multiuser data stream divided into a plurality of observation intervals, comprising computing a filter for each observation interval of the data stream, applying interference cancellation to the data stream for each observation interval, applying the filter to the data stream for each observation interval from the interference cancellation to produce individual amplitude estimates for each observation interval, computing new amplitude estimates using the individual amplitude estimates; and passing the new amplitude estimates back to the filter for iterative processing until a final condition is obtained.

One embodiment is a turbo-decoding system for joint signal demodulation, comprising a data stream from a plurality of users divided into a plurality of observation intervals. There is a plurality of symbol processing nodes processing the observation intervals to compute symbol estimates for the data stream within the observation interval. A plurality of decoder nodes is present for processing the symbol estimates and producing a plurality of symbol likelihoods. There is a plurality of amplitude update nodes processing the symbol likelihoods and calculating a plurality of amplitude update vectors. And, there is an amplitude estimator node processing the amplitude update vectors and producing an amplitude estimate update, wherein the amplitude estimate update is passed back to the processing nodes for iterative processing between the symbol processing nodes, the decoder nodes, the amplitude update nodes, and the amplitude estimator node until a final condition is obtained.

The turbo-decoding system can encompass a plurality of memory units, wherein at least one memory unit is coupled to each of the processing nodes and to each of the amplitude estimation nodes. There can also be a first system area network (SAN) coupling the processing nodes and the decoder nodes, a second system area network (SAN) coupling the decoder nodes and the amplitude estimation nodes, a third system area network coupling the amplitude estimation nodes and the amplitude estimator, and a fourth system area network coupling the amplitude estimator and the processing nodes. The processing nodes, the decoder nodes and the amplitude estimation nodes can even be one set of nodes. A set of nodes can also be comprised of at least one processor.

A further embodiment of the system includes wherein the likelihood symbols from the decoders are accessible at any time for post-processing. The processing nodes can further comprise a thresholder to convert the symbol estimates to symbol bits. And, the bank of decoder can also perform de-interleaving, rate identification, de-puncturing and de-scrambling.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

The methods and embodiments of the joint symbol, amplitude and rate estimator disclosed herein enable implementations of advanced receiver processing providing high quality real-time processing for multiple access systems, including overloaded situations. One embodiment illustrates the signal processing technique applicable to many variations that are all within the scope of the invention. It should be understood that the reference to a data stream of multiple users is understood to represent digital data from a number of references and not necessarily multiple users in communications.

Figure 1:
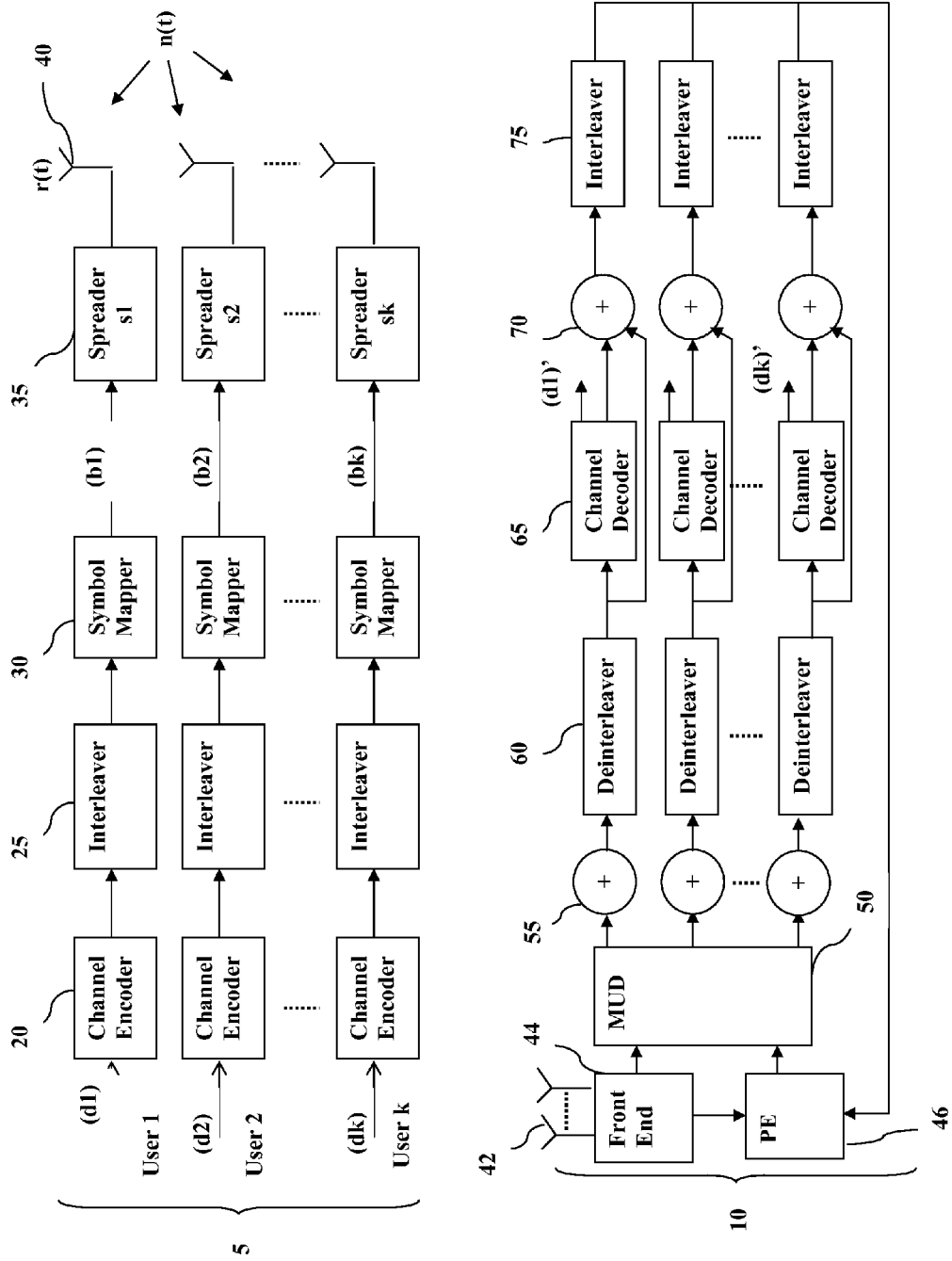
FIG. 1 illustrates a basic diagrammatic processing perspective for the prior art transmitter end and receiver end with iterative multiuser detection processing.

In order to fully appreciate the processing of the present invention, it is useful to consider a description of the processing known in the art. Referring to FIG. 1, prior art transmitter section 5 and receiver section 10 is depicted with MUD processing. There are K users with data $d_1$-$d_k$ as the input to the channel encoders 20 where the data is convolutionally encoded at a code rate $R_k$. The interleaver 25 performs the interleaving of the data, which is then symbol mapped by the symbol mapper 30, such as BPSK symbol mapped with data symbols having a duration T. Each data symbol is then modulated by a spreading waveform from the spreader 35, and the signal data $s_k(t)$ is output from the transmitter end with a number of data symbols per user per frame. In the typical wireless communication application presented herein, a number of users (1-K) generate signals that are transmitted by antennas 40 into free space. The transmission on hard-wire or fixed wire systems is also known in the art, however the present example is directed towards the wireless communications systems. Noise n(t), such as white Gaussian noise, is an inherent component of most transmission signals and some random noise components are generally present in transmitted data signals r(t).

On the receiving end 10, antenna(s) 42 receive the transmitted signals r(t) as well as the various interfering signals, such as n(t). There is normally a noise component n(t) that is introduced from the environment of a random nature in the received signal. While any noise that has a repeatable or non-random nature can be eliminated through processing, random noise elements are reduced in other manners such as filtering but are inherent conditions. The various signals are received at antennas 42 wherein there is typically one signal for each polarization feed. The received signals represent directly received signals, as well as multi-path signals from the same user, and interfering signals from other users.

The input signals of raw non-manipulated data at the receiver 10 is comprised of the aggregate of many signals from many different transmitters/users, where each signal is generally assigned a channel (frequency, timeslot, and/or spreading code) from a finite set of channels. The interference from these various users generally requires complex processing and associated processing time. The input data represents a vector of data, transferred at some rate (e.g., the symbol rate), and this data is typically transmitted to a matched filter (not shown).

The plurality of signals from each antenna 42 is processed in a RF front end unit 44. The front end unit 44 generally downconverts the higher frequency signals into baseband signals and provide processing and filtering as is known in the art. The baseband signals are also digitized by analog to digital converters (ADC). The front end 44 cooperates with the parameter estimation unit 46 to retrieve needed information for the signals such as relative received timing offsets, carrier phase, frequency offsets, received amplitudes, and multipath structure for each of the interfering signals present in the received signal.

A parameter estimation unit 46 is coupled to the front end 44 and processes the various parameters for the received vector data. A parameter estimator 46, as known in the art, is a broad description for a unit that provides information to the MUD 50 such as convolutional code, signatures, and multiplexing format. While the term parameter estimator is used herein, the term is intended to be interpreted in the broader sense as known in the joint demodulation field. The parameter estimation module 46 generally tries to estimate timing, signal amplitudes, phases, polarization, and identification of transmission channels.

The MUD element 50 consists of functional blocks that process the digital data and extract the user symbol streams. The MUD 50 performs pre-processing and converts the baseband digital data into the proper format for further processing according to the detection scheme. The format is often one measurement per 'dimension' per symbol. The MUD unit 50 outputs a bit (or symbol) stream associated with each interfering signals present on the channel for one data block.

Turbo MUD processing assumes knowledge of various parameters such as relative received timing offsets, carrier phase, frequency offsets, received amplitudes, and multipath structure for each of the interfering signals present in the received signal. This input data represents raw data after some front end processing such as downconversion, amplification, and analog-to-digital conversion. MUD 50 needs some raw data parameters in order to establish accurate decision trees for processing.

There is an iterative processing topology with a MUD section 50 that interacts with the K number of channel decoders 65 for the received signal r(t) for each user. The multiuser detector 50 is generally a SISO detector, receiving and outputting soft values, although hard value processing is known in the art. The MUD section 50 utilizes a priori information and delivers values such as a posteriori log-likelihood ratio (LLR) data of a transmitted '+1' or '−1' for each bit of every user. Certain a priori information is computed by the channel decoder 65 from a previous iteration which is interleaved and fed back to the MUD section 50. The interleaver 60 and deinterleaver 75 perform the interleaving and deinterleaving functions respectfully for the encoding schema. Likewise, the summers 55, 70 perform the summations for the data. Once the processing is complete the channel decoders 65 produce the output data stream (dk)' representing the best estimate of the transmitted signal (dk).

Various schemes for TurboMUD processing are well known in the art and utilize a priori information about the received signals wherein the processing continues through a number of iterations until certain conditional parameters are satisfied. The basic Turbo-Mud procedure is presented in published literature such as Poor, "Turbo Multiuser Detection: An overview," IEEE 6$^{th}$ Int. Symp. On Spread-Spectrum Tech. And Appli., NJIT, New Jersey, Sep. 6-8, 2000 and Alexander, Reed, Asenstorfer, and Schlegel, "Iterative Multiuser Interference Reduction: Turbo CDMA," IEEE Trans. On Comms., v41, n7, July 1999. The iterative MUD algorithm such as representative of the approaches used to incorporate turbo decoding methods into joint MUD/FEC (Fourier Error Correction) decoding and to then reduce the complexity of the system are known in the art.

The bit streams from the MUD 50 are passed to a bank of error correction decoders unit 65. The decoders 65 calculate conditional probabilities, one for each decoded symbol of each user, and output them as confidence values back to the MUD 50. In one embodiment, there is a bank of error correction decoders 65 such as Viterbi decoders or MAP.

Soft outputs for each bit of each user from the bank of decoders 65 is fed back to the multiuser detector 50 for each iteration, one stream of outputs for each interfering user present in the received signal. These soft outputs are passed back to the MUD 50 to produce an improved stream of soft bit (or symbol) decisions that fed into the decoder 65 for another iteration of improvement. The information between the MUD 50 and the decoders 65 repeats in subsequent iterations until an asymptote is reached or the desired performance level is attained. At that point, estimates of the data sequences for all active users are output. Operation then commences for the next block of data, repeating the process described above. The multiuser detector 50 takes these soft inputs along with the original raw input signal to calculate an improved, less corrupted bit stream for each user. This iterative process continues until a desired metric is reached or a fixed number is reached. At that point, estimates of the data sequences for all active users are output. Operation then commences for the next block of data, repeating the process described above.

The number of iterations for processing between the MUD 50 and the decoders 65 can be set to a fixed counter or by checking if there were significant changes to the data from the last iteration. Once the data is no longer being altered or reaches a certain iteration counter limit, the data from the decoder 65 can be output as final estimates of what the user sent, (dk)'. A fixed number of iterations can be stored and used and processed by the decision block. Alternatively, the information between the multiuser detector 50 and the decoders 65 repeats in subsequent iterations until an asymptote is reached or the desired performance level is attained. A buffer can store the previous values and compare them to the latter processed values during the iterative process.

MMSE detectors with prior information are usually described in a turbo or iterative application, but also function in non-iterative operations. As described herein, a complete solution to the problem is computed, and one approximate (low complexity) method is described. Furthermore, prior schemes are generally inferior for overloaded systems, and this is alleviated by the present invention.

Figure 2:
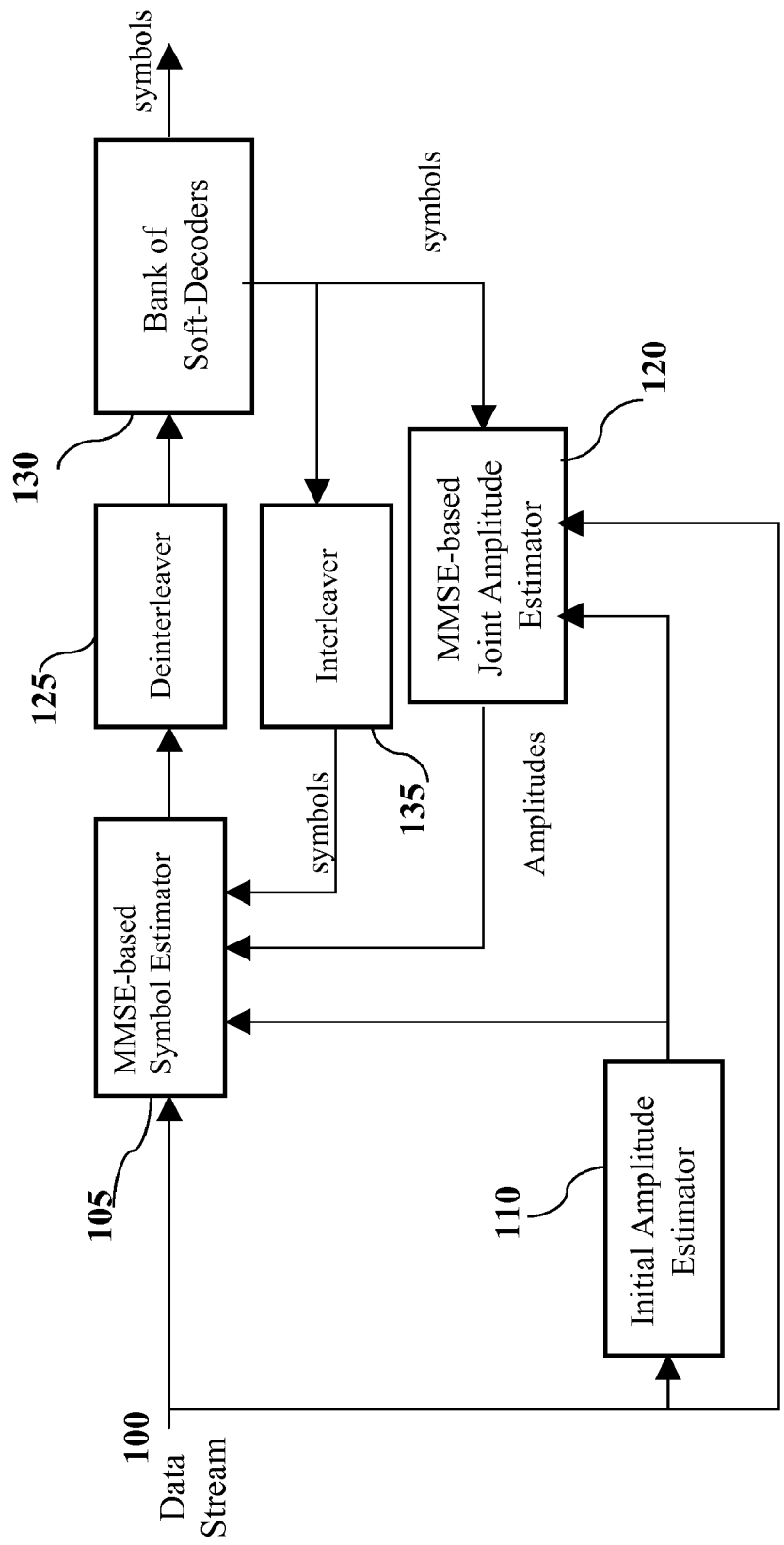
FIG. 2 is a block diagram perspective showing joint symbol amplitude and data rate estimator for one embodiment of the invention.

The apparatus in FIG. 2 is now described in more detail. A Data Stream 100, potentially complex, is received from some source. For the case of Code Division Multiple Access (CDMA) communications schemes, the data stream is sampled by some multiple of the chip rate. For TDMA communication schemes, the data stream is sampled at some multiple of the symbol rate. The received signal can effectively be modeled as the linear combination of many co-channel signals, mathematically illustrated by $$r[n] = \sum_{i=1}^{F} \sum_{k=1}^{K} b_k[i] a_k s_k(nT_n - iT_i) + n_w(nT_n). \quad \text{Equation 1}$$

The term $b_k[i]$ represents the symbol for user k at time index i. The term $s_k(nT_n - iT_i)$ represents the user's signal characteristic for sample index n for the symbol period i for the user k. The characteristic waveform, $s_k(\cdot)$, is normalized such that the amplitude of the transmitted signal for user k is represented by $a_k$. The symbol period is defined by $T_i$ and the sample period is represented by $T_n$. The linear model represents a summation of K separate users and over F symbols. The received signal can represent a collection from multiple sources. For example, the collection may consist of multiple antennas, not necessarily co-located, with potentially different polarizations.

The user's signal characteristic, $s_k(nT_n - iT_i)$, combines a sequence of signal transformations: pulse shaping filter, signal delays, receiver filters, code channels (for CDMA) and multipath. It should be understood that the characteristic waveform is not restricted to a sample or symbol interval.

The multiple access interference model in Equation 1 is represented concisely using matrix notation in Equation 2. The KF symbols, corresponding to the KF simultaneous users, is represented by the KF-element vector, b[i] at time i. A linear model is used to represent the received signal at time index i by $$r[i] = SAb[i] + n_w[i], \quad \text{Equation 2}$$

where b[i] represents the KF symbols at time index i. The term S is a N×KF matrix representing the combination of the spreading code, channel codes, pulse shaping filter, and propagation effects $$S = \begin{bmatrix} s_1[1,i] & s_2[1,i] & \ldots & s_{KF}[1,i] \\ s_1[2,i] & s_2[2,i] & \ldots & s_{KF}[2,i] \\ \vdots & \vdots & \ddots & \vdots \\ s_1[N,i] & s_2[N,i] & \ldots & s_{KF}[N,i] \end{bmatrix} \quad \text{Equation 3}$$

The matrix entries, $s_k[n,i]$, represents the $n^{th}$ sample of the signal characteristic waveform for user k at time i. The term A is a KF×KF diagonal matrix that represents the complex signal amplitudes, which can include phase and polarization weighting. The term $n_w[i]$ is a N×1 vector that represents additive white Gaussian noise (AWGN).

Referring again to FIG. 2, the data stream 100 represents a vector of data, representing the received signal. This data is communicated to the symbol hypothesis testing module 105 which is indicated in this implementation as Minimum Mean Squared Error (MMSE) based symbol estimator. The MMSE implementation for symbol hypothesis testing 105 is better for computational efficiency however other forms of symbol estimators such as the maximum likelihood detector are within the scope of the invention. The maximum likelihood detector is a brute force approach which performs an exhaustive evaluation of the Euclidean distances between the received samples and the linear model of the samples using every possible hypothesis of the bit sequence. Instead of the optimal detector for the symbol estimation testing module 105, more computationally efficient forms of symbol hypothesis testing includes, the M-algorithm, T-algorithm, etc. Although the most efficient approach appears to be the MMSE-based symbol estimator, another efficient implementation for symbol estimation is referred to as the Q-algorithm, disclosed in U.S. patent application Ser. No. 10/105,918, filed Mar. 25, 2002 entitled "System for Decreasing Processing Time in an Iterative Multi-User Detector System". The Q-algorithm used for the MMSE-symbol estimator cancels interference based on symbol estimates obtained from thresholding the symbol likelihoods.

The computational efficiency utilizing the MMSE based symbol estimation is described in further details for the MMSE-based joint amplitude estimation and the parallelization of the algorithm. It should be noted that the symbol hypothesis testing is performed following completion of the initial amplitude estimate.

The same data vector 100 is passed to the initial amplitude estimation module 110. As indicated by the name, the purpose of initial amplitude estimation module 110 is to provide an initial estimate of the amplitude for each interfering signal. The approach implemented in initial amplitude estimation module 110 consists of incoherently integrating the energy out of a properly normalized matched filter for all users determined to be active. Note these users can be transmitted over code, temporal, and/or frequency channels and this estimation procedure are appropriate for these modes of digital communication. Part of the function performed in the initial amplitude estimation module 110, is the identification of which users are active. User identification can be easily obtained via an energy detector based on some sufficiently long observation interval that can determine activity on a channel: code, time slot, or frequency channel. The energy detector is generally integrated within the initial amplitude estimation module 110.

The initial amplitudes from the estimator 110 are passed to the MMSE-based symbol estimator 105 and the MMSE-based Joint Amplitude Estimator 120. The MMSE-based symbol estimator 105 uses the initial amplitude estimate only on the first iteration, for all other iterations it uses the amplitude estimates from the MMSE-based Joint Amplitude Estimator 120. This module may implement any type of symbol hypothesis testing procedure however an MMSE-based approach is used because of computational efficiency. It should be understood that other linear detectors, such as the decorreator, may also be used for computational efficiency. While the linear detectors are efficient, the performance is sacrificed through BER performance and loading capacity.

There are numerous non-linear symbol-hypothesis testing procedures adaptable to the present invention, including the M-algorithm/T-algorithm; maximum likelihood; decorrelating decision-feedback detector (DDFD) and improved decorrelating decision-feedback detector (IDDFD); successive interference cancellation (SIC), parallel interference cancellation (PIC) or multi-stage detector; block-iterative interference cancellation. A further symbol-hypothesis testing implementation is described in the commonly owned application entitled "Deferred Decorrelating Decision-Feedback Detector for Supersaturated Communications", U.S. patent application Ser. No. 10/423,655, filed Apr. 25, 2003.

The MMSE-based symbol estimator 105 provides symbols estimates to a bank of single user decoders 130. The symbols estimates from the symbol estimator 105 are routed to the decoders 130 based on user number. For example, all symbol likelihoods corresponding to the first user are passed to the decoder dedicated to the first user. This mapping is repeated for all users. The single user decoders consist of a bank of K decoders that may consist of Soft-output Viterbi or Maximum A Posteriori based techniques such as BCJR. Soft-input, soft-output (SISO) decoders are used in one embodiment for this implementation, but hard values can be processed as is known in the art.

Inherent in most processing is a de-interleaving, rate identification, de-puncturing and de-scrambling processing depicted merely as deinterleaving 125 for illustrative purposes. The symbol estimates and their respective likelihoods are output from the bank of decoders 130 for one of the most-likely data rates. In addition, symbol likelihood estimates from the decoders 130 are also fed back around to both the MMSE-based symbol estimator 105 and MMSE-based amplitude estimator 120 respectively. However, prior to feedback the symbol likelihoods are processed by an interleaving section 135 performing re-interleaving, re-puncturing, re-scrambling and symbol repeating (for low rate frames). The purpose of this re-coding task is to properly emulate the interference.

As referenced herein, the term 'data rate' refers to the rate at which the information bits are transmitted over the channel, defined in terms of bits per second. Sometime the data can be transmitted at one of a number of different rates. The likelihoods of the bits are maximized when the data rate is known. However, if the receiver is non-cooperative, the 'most likely' data rate must be identified. One approach for determining the most likely data rate is through joint maximization of the bit likelihoods and data rate.

The new symbol likelihoods from the decoders 130 are used to update previous amplitude estimates in the joint amplitude estimator 120. The procedure for processing the MMSE-based amplitude estimator is described in further detail herein. The new amplitude estimates from the joint amplitude estimator 120 are passed to the MMSE-based Symbol Estimator 105 that re-estimates the symbols based on prior information on the symbols and the updated parameter estimates. These updated symbol estimates from the symbol estimator 105 are then re-routed to the bank of decoders 130. This process is repeated for either some fixed number of iterations or until the estimates of the bit error rate or frame error rate achieve some desired level.

Figure 3:
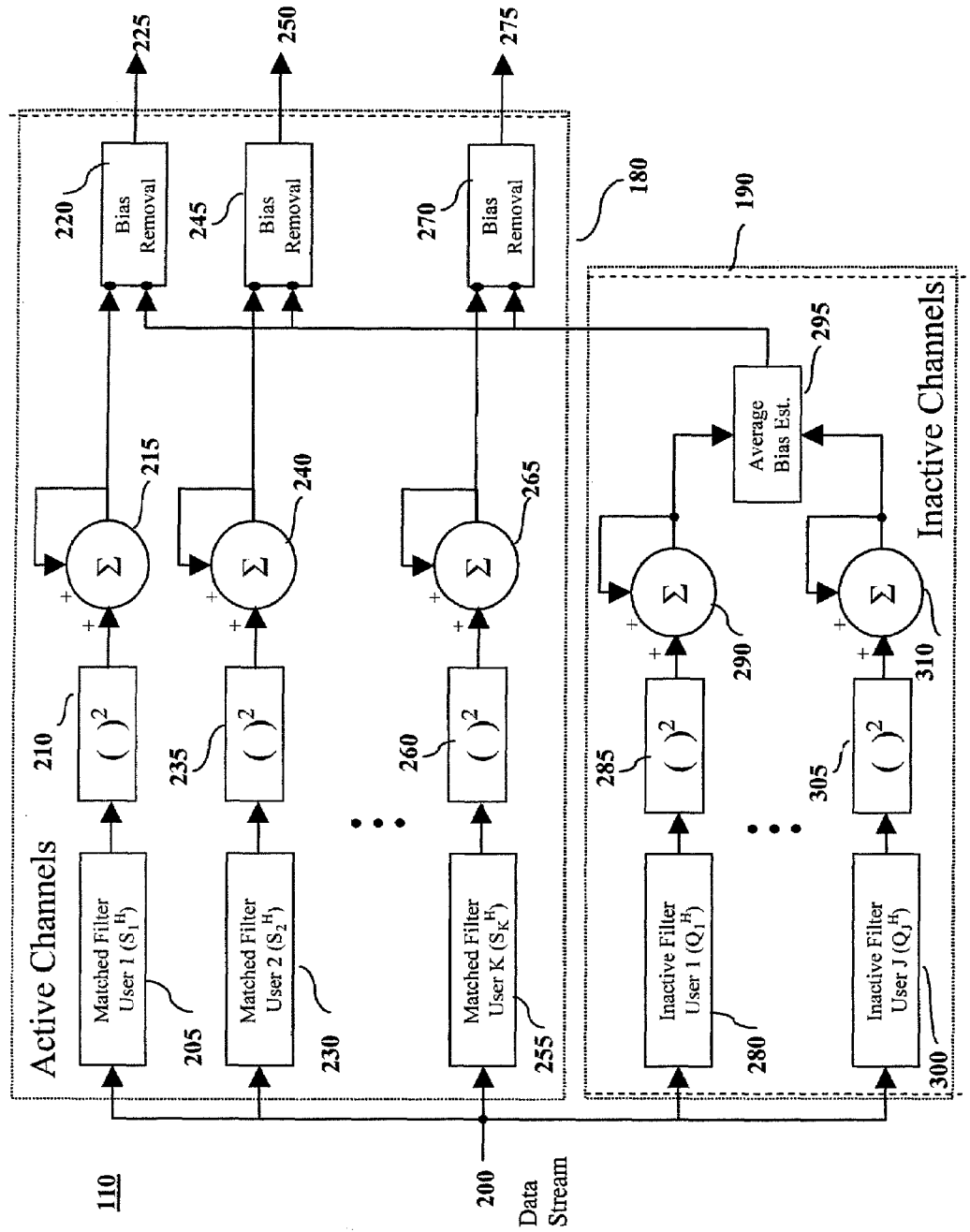
FIG. 3 is a schematic block diagram showing initial amplitude estimation.

FIG. 3 illustrates the system and processing for calculating initial amplitude estimates with the Initial Amplitude Estimator 110 of FIG. 2. Referring to FIG. 2 and FIG. 3, the initial amplitude estimate obtained from the Initial Amplitude Estimator 110 is based on the incoherent integration of the matched filter output of the Active Channel 180 over some observation interval. The procedure consists of applying a bank of matched filters 205, 230, 255 for all users K and all symbols F to the received data vector 100. The KF×1 vector representing the matched filter outputs is represented by $$y = S^H r = S^H S A b + S^H n_w.$$  Equation 4

The estimate of the amplitude for a user k is based on summing the squared outputs of the matched filter for that user k, summed over an observation interval of F symbols. An estimate of the amplitude squared is represented by $$\hat{a}_k^2 = \frac{1}{F}\sum_{i=1}^{F} |y_{i,k}|^2 \qquad \text{Equation 5}$$

The summation over F is performed for all K users to obtain K initial amplitude estimates for the K users. Since the estimate is based on incoherent integration, the estimate is biased which is illustrated by the expected value of the initial amplitude estimate for an arbitrary users k, $$E[\hat{a}_k^2] = a_k^2 + \frac{1}{F}\sum_{i=1}^{F}\sum_{\substack{j=1 \\ j\neq k}}^{K} \rho_{j,k}^2(i)a_j^2 \qquad \text{Equation 6}$$

where the bias is represented by the last term in Equation 6 and $\rho_{j,k}^2(i)=(s_k^H(i)s_j(i))^2$. Note that the bias in Equation 6 is based on the expected values of the bits in the vector b, in Equation 4, equaling zero. This is mathematically represented by $$E[b]=0$$

In addition, Equation 6 assumes the symbols are defined such that $b_i^2=1$. A generalization of Equation 6 for the case of non-zero mean bit values and $b_i^2 \neq 1$ is obvious.

An inactive user 190 is defined as a signature signal that is not present. The expected value of the amplitude estimate for an arbitrary inactive channel is defined as $$E[\hat{a}_{inactive}^2] = \frac{1}{F}\sum_{i=1}^{F}\sum_{j=1}^{K} \rho_{j,inactive}^2(i)a_j^2 \qquad \text{Equation 7}$$

where $\rho_{j,inactive}^2(i)=(s_{inactive}^H(i)s_j(i))^2$. Since no signal is present for inactive users, a nonzero value for the expected value of the estimate for amplitude squared for inactive signature vectors is due to the presence of other active channels. Comparing Equations 6 and 7 reveals that examination of the estimate of squared amplitudes for non-active users can be used to estimate the bias relative to active users. Thus the Initial Amplitude Estimation concept is based on Equations 5 through 7 is illustrated in FIG. 3.

A data stream 200 representing the received signal, potentially complex, is received from some source. A bank of filters 205, 230, 255, 280 and 300 is applied to the data stream 100. The Active Channel 180 set of filters 205, 230, 255 consists of filters matched to users that have been determined to be active based on an energy detector. Filter 205 corresponds to a filter matched to the signature signal for user 1. Similarly, filter 230 corresponds to a filter matched to the signature signal for user 2. It should be noted that the size of the bank of matched filters is based on the number of users determined to be active and represented by the term K.

The output data from each matched filter (1-K) 205, 230, 255 is then processed by a squaring operation 210, 235, 260 for all K users. The outputs from the squaring operations 210, 235, 260 for each active channel user (1-K) are then passed to a bank of summers 215, 240, 265 which performs the incoherent integration. The bank of summer 215, 240, 265 for each user 1-K used to implement Equation 5, accumulates energy in each of their respective processing chains. The proper scaling required for averaging is included in the output of the summers. As previously mentioned these estimates of squared amplitude are biased, therefore, the bias removal component must be implemented to minimize the bias.

A set of filters 280, 300 for the Inactive Channel 190 representing those channels that were determined to be inactive based on an energy detector. The bank of filters 280, 300 matched to the inactive user's signature signals is applied to the data stream 200 and processed. The size of the bank of filters 280, 300 is based on the number of users determined to be inactive, defined herein as the number J.

Following the processing of the inactive filters 280, 300 for the users 1-J, the user data is further processed by a squaring operation 285, 305 for all J users. The outputs from the squaring operations 285, 305 for each inactive channel user (1-J) are then passed to a bank of summers 290, 310. The bank of summer 290, 310 for each user 1-J accumulates energy in each of their respective processing chains. The proper scaling required for averaging is included in the output of the summers 290, 310, wherein the output is then processed by the Average Bias Estimator 295.

Following the computation of the amplitude bias by the Average Bias Estimator 295, the bias is passed to Bias Removal 220, 245, 270 that is applied to each of the Active Channel Users 1-K. The illustration in FIG. 3 shows the output from the active channel summers 215, 240, 265 going to all bias removal modules 220, 245, 270. The initial amplitude squared estimate obtained for the active channels has an estimate of the bias removed in modules 220, 245, 270. Following the bias removal, the initial amplitude squared estimates 225, 250, 275 for each user 1-K are passed out to the remaining processing shown in FIG. 2.

FIG. 3 shows the computation of one amplitude bias in module 295, which is then applied to all bias-removal modules 220, 245, and 270, for all active channels. The processing configuration of FIG. 3 is also extendable to other embodiments in which different biases are computed for different sets of active channels, which are obvious extensions and within the scope of the present invention. For example, in a wireless communications system the bias removal could be restricted to channels within certain sectors. More specifically, for all non-active channels identified in a sector, a bias estimate is computed and then applied to all active channels in the same sector. Therefore, active channels identified in a different sector will only use a bias based on non-active channels in this same sector.

Figure 4:
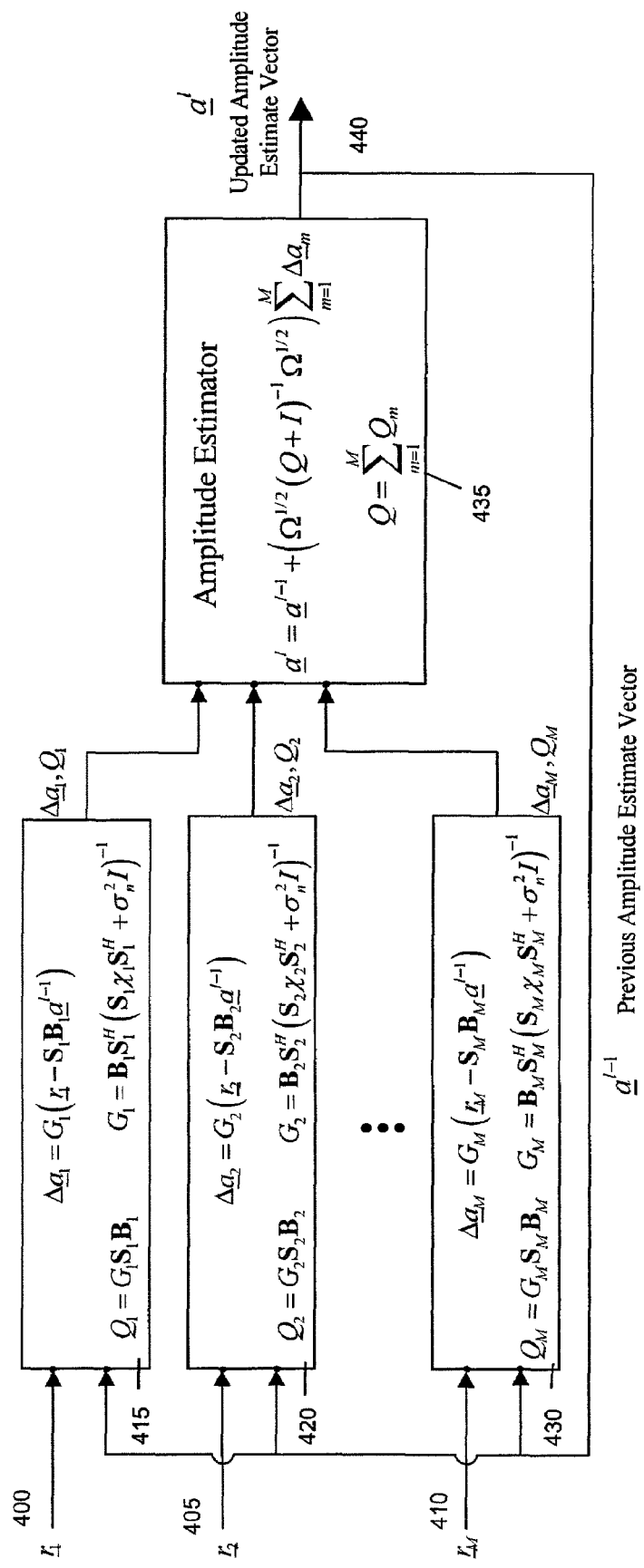
FIG. 4 is a schematic block diagram showing joint amplitude estimator.

Referring to FIG. 2, the initial amplitude squared estimates are updated in the MMSE-based Joint Amplitude Estimator 120. The apparatus for updating these amplitude squared estimates is described in FIG. 4. The solution described in FIG. 4 is based on the assumption that the amplitude is nearly constant over some observation window. Since this solution is based on the MMSE criteria, this approach is easily extended to time-varying amplitudes, however, only the windowed based estimator is detailed herein for illustrative purposes. For example, when the amplitude fluctuates by rate, the amplitudes over multiple frames are linked based upon the data rate. Incorporating data rate into the amplitude estimator, the module described in FIG. 4 actually evolves into an energy-per-bit estimator. When the amplitude fluctuates based on temporal instability, then this implementation is extended into a Kalman filter framework by using a temporal model of the channel variation. The Kalman filter equation itself is well known to those in the art.

Referring to FIG. 2 and FIG. 4, the stream of data representing the received signal 100 is passed to the MMSE-based Joint Amplitude Estimator 120. This data stream 100 is divided up into M observation intervals as illustrated by $r_1, r_2$, through $r_M$ 400, 405, 410. These intervals can be based on distinguishing attributes such as time, code, or frequency. For the example presented herein, the observation interval refers to time. These observation intervals each enter a different processing section 415, 420, 430, representing 1 to M observation intervals. In each processing module, 415, 420, 430, an MMSE filter is computed which is defined for an arbitrary observation interval m as:

$$G_m = B_m S_m^H (S_m \chi_m S_m^H + \rho_n^2 I)^{-1}.$$ Equation 8

The term $B_m$ refers to a diagonal matrix representing the expected bit or symbol value in interval m for all K users. For example, $$B_m = \begin{bmatrix} \hat{b}_1 & 0 & \cdots & 0 \\ 0 & \hat{b}_2 & \cdots & 0 \\ \vdots & \vdots & \ddots & \vdots \\ 0 & 0 & \cdots & \hat{b}_k \end{bmatrix},$$ Equation 9 where $\hat{b}_k$ represents the expected value of the symbol for user k. For illustrative purposes, for BPSK systems, $\hat{b}_k = 2p_k - 1$, where $p_k$ equals the probability that the symbol equals 1. The term $S_m$, is similar to that presented in Equation 2, except here $S_m$ represents the "S-matrix" defined over a single observation interval, while S in Equation 2 is defined over F observation intervals. Therefore, S in Equation 2 contains the $S_m$ defined herein. The term $\chi_m$ represents the amplitude uncertainty and is rewritten as:

$$\chi_m = (\Omega + A^2) \Lambda_m$$ Equation 10 which more clearly defined the amplitude uncertainty in terms of the bit uncertainty, $\Lambda_m$, the initial amplitude uncertainty, $\Omega$, and the expected value of the amplitude A. The terms, $\Lambda_m$, $\Omega$, and A are all diagonal matrices, and each element along the diagonal corresponding to a different active user, therefore, $\chi_m$ is a diagonal matrix. This formulation assumes the amplitudes and corresponding uncertainties are constant for the M observation intervals.

Following the computation of M different MMSE filters in each of the 1-M modules 415, 420, 430, each MMSE filter is applied to components of the respective data stream 400, 405, 410 corresponding to the same observation interval.

Prior to application of the MMSE filter, interference cancellation is performed based on the expected value of the bits, represented by $B_m$ and prior estimates of the amplitude for all K users, represented by the K×1 vector $a^{l-1}$. The interference cancellation is represented by $$\tilde{r}_m = r_m - S_m B_m a^{l-1}.$$ Equation 11

And, each MMSE processor cancels out different interference.

Therefore, application of the MMSE filter following interference cancellation is represented by $$\Delta a_m = G_m (r_m - S_m B_m a^{l-1})$$ Equation 12.

The amplitude estimator is defined in module 435 of FIG. 4. It is an iterative formulation that updates previous estimates, represented by $a^{l-1}$, with information based on new estimates of the users' bits and data rate. These new estimates are represented by $a^l$. The MMSE-based joint amplitude estimator 435 combines the individual estimates, $\Delta a_m$, in a weighted manner. The weighted combination in this embodiment is expressed by:

$$a^l = a^{l-1} + (\Omega^{1/2}(Q+I)^{-1}\Omega^{1/2}) \sum_{m=1}^{M} \Delta a_m$$ Equation 13 where $$Q = \sum_{m=1}^{M} Q_m$$ Equation 14

As indicated by Equation 13 and illustrated in FIG. 4, the individual estimates from the filter modules 415, 420, 430 are passed to the Amplitude Estimator 435 for each interval 1-M. These individual estimates, $\Delta a_m$, are K×1 vectors which are then summed together in Amplitude Estimator 435. Theses estimates are then weighted by $(\Omega^{1/2}(Q+I)^{-1}\Omega^{1/2})$ where $\Omega^{1/2}$ is a diagonal matrix containing the standard deviation of the amplitude estimates and Q is represented in Equation 14. The term Q is a summation of quadratics computed in the filter modules 415, 420, 430. Each quadratic is computed by $$Q_m = G_m S_m B_m$$ Equation 15 which is shown to be based on the MMSE filter for the respective observation region defined in interval m. Therefore each filter module 415, 420, 430 responsible for an observation interval must compute: the MMSE filter (see Equation 8); apply interference cancellation to the section of the data stream corresponding to the observation interval (see Equation 11); apply the MMSE filter to the interference mitigated data vector (see Equation 12); and computed the quadratic (see Equation 15).

In this embodiment the outputs of each module 415, 420, 430 is a K×1 vector $\Delta a_m$ and a hermitian matrix $Q_m$ which is a K×K matrix with K (K+1)/2 unique elements. These two outputs are passed to the Amplitude Estimator 435 for each interval 1-M. The prior amplitude estimates, $a^{l-1}$ are updated to $a^l$ and passed out from the Amplitude Estimator 435 back to the individual filter modules 415, 420, 430 defined for the observation intervals. This feedback is part of the iterative implementation inherent in this MMSE formulation.

Referring again to FIG. 2, it should be understood that the amplitude estimates are not updated until the bits (or symbols) have been updated in the bank of decoders 130. Following the processing by the MMSE-based symbol estimator 105 and the decoders 130 in FIG. 2, the symbols are fed back to the MMSE-based joint amplitude estimator 120 where prior amplitude estimates are updated as detailed herein. As previously described, the number of iterations is typically dictated by the user which is defined for either a fixed iteration number or until the frame error rate or estimate bit error rate metric reaches some desired level.

Once processing is completed, the updated amplitude estimate vector 440 is transmitted from the MMSE-based Joint Amplitude Estimator 120 to the MMSE-based symbol estimator 105. Since for this particular implementation, the amplitudes are constant over the observation interval described for M smaller observation intervals, the same amplitude estimate 440 is reported to each MMSE-based symbol estimator 105. This approach is easily modified for a variable amplitude estimate which varies over the entire observation interval.

Figure 5:
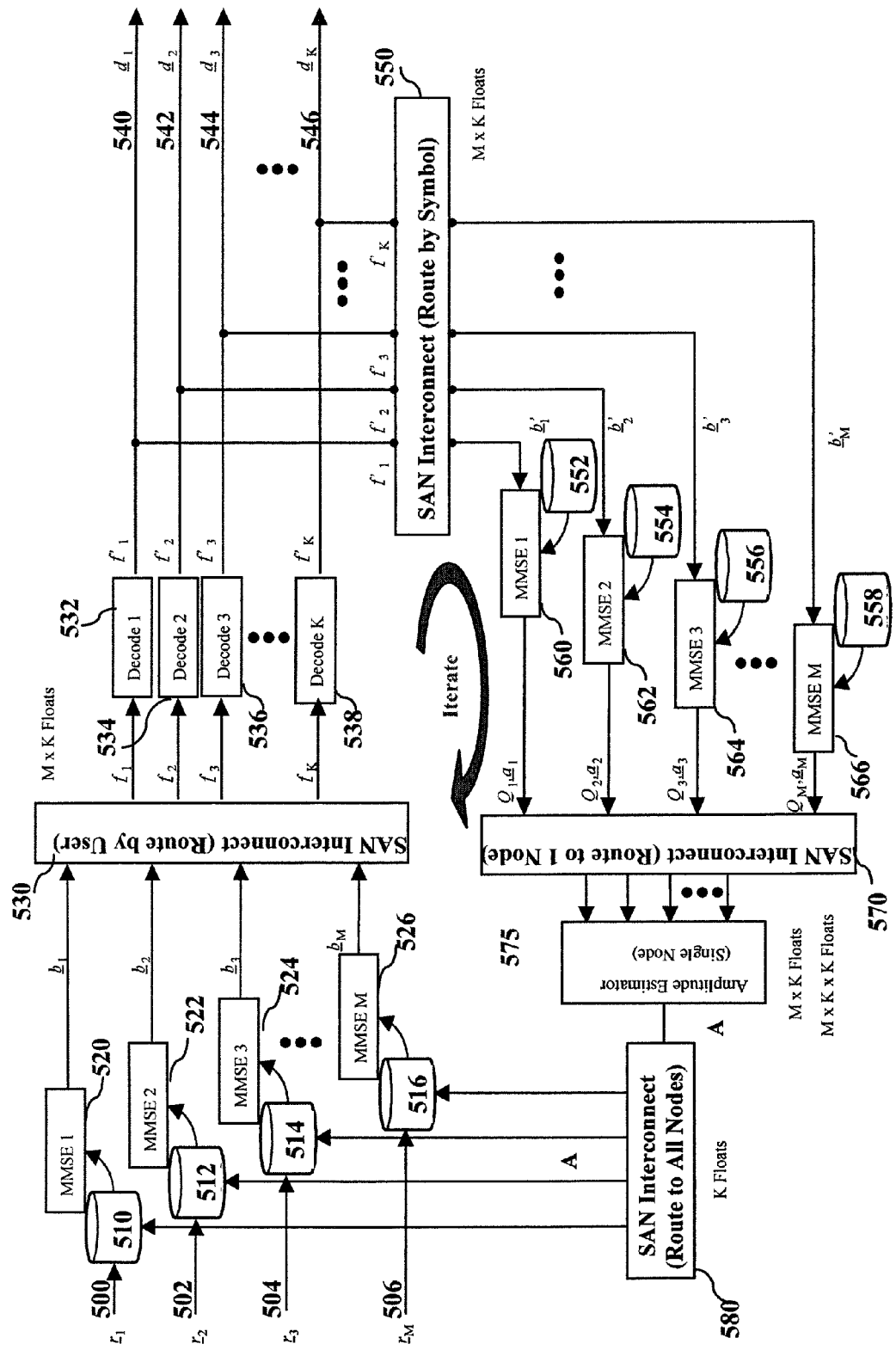
FIG. 5 is a schematic block diagram showing parallelization of joint symbol amplitude and data rate estimator.

The apparatus in FIG. 5 is one embodiment of a hardware implementation that provides a more detailed characterization of the processing shown in FIG. 2. It should be noted that FIG. 5 shows an implementation that parallels the joint estimation based on M observation intervals. The data stream in 100 of FIG. 2 is partitioned into M observation intervals as the data vectors 500, 502, 504, 506 representing intervals 1-M. As in previous diagrams, the number of observation intervals is generalized to M intervals. The observation intervals may overlap (not necessarily disjoint) to account for asynchronous reception and multipath signals.

These data vectors 500, 502, 504, 506 are processed immediately by a bank of MMSE filters which are implemented on the M processors, 520, 522, 524, 526, for all M observation intervals and each processor simultaneously estimates symbols for all K users. The filter processing can be considered a node, wherein a node is a generic processing component as is known in the art, such as a microprocessor chip or processing board, and wherein it should be readily apparent that there can be more than one processor per node.

In addition, these data vectors 500, 502, 504, 506 are read into local memory 510, 512, 514, 516 on the processors, because they are used repeatedly for the multiple iterations in this iterative approach to symbol, amplitude, and rate estimation. Any of the forms of memory known in the art are applicable.

Each symbol estimation MMSE processor, 520, 522, 524, 526 outputs $b_m$, which is a vector of K symbol likelihoods or symbol bits for observation interval m. Recall that K corresponds to the number of users and therefore $b_m$ represents the collection of symbol estimates for K users in observation interval m. Symbol bits are provided on the output if thresholding is performed within the MMSE processor 520, 522, 524, 526. The output from each MMSE processor, 520, 522, 524, 526, is intended to represent M K×1 vectors passed to the system area network (SAN) 530 which will then pass K M×1 frames of likelihoods (or symbols) to a bank of decoders 532, 534, 536, 538 for each user 1-K. The benefit of supplying likelihoods to the decoders 532, 534, 536, 538 is the improved performance when using soft-decoders. It should be noted that the same processing nodes used for implementing the bank of MMSE filters for symbol estimation for processors 520, 522, 524, 526 can be used to implement the K decoders, 532, 534, 536, 538 which are partitioned between the compute nodes. However, this embodiment also covers an implementation for hardware dedicated to MMSE processing and separate hardware for decoding.

The following discussion describes one embodiment for an implementation when a bank of processing nodes is used for both MMSE processing and decoding. Symbol likelihoods are routed over the SAN 530 based on the assignment of decoders 532, 534, 536, 538 to processing components for decoding. The SAN 530 routes the M K×1 vectors of symbol likelihoods from the symbol estimation processing previously used to perform MMSE-based symbol estimation on processors 520, 522, 524, 526 to the same set of processing nodes that now perform the decoder processing on the bank of decoders 532, 534, 536, 538. The SAN 530 passes K frames of M×1 symbol estimates to the K decoders 532, 534, 536, 538, wherein the frames of symbols are represented by $f_k$ for the K users. The frames, $f_k$, represent a frame for each user that contains M symbols.

The number of decoders 532, 534, 536, 538 corresponds to the number of users, 1-K. The bank of decoders 532, 534, 536, 538 may implement hard-in, soft-out (HISO) or soft-in, soft-out (SISO) decoders. In addition to decoding, the bank of decoders 532, 534, 536, 538 performs descrambling, de-interleaving, de-puncturing, and rate identification. The output of each decoder 532, 534, 536, 538 is, $f_k'$, which is a M×1 vector representing an update of M likelihoods in the frame following the implementation of the decoders. In addition, the decoders 532, 534, 536, 538 supply likelihoods of the information bits values $d_k'$ for the same collection of symbols.

These information bits are passed out as output 540, 542, 544, and 546. The number of bits per user is dependent on the data rate, and there bit likelihoods are available at any time in the iterative scheme for post-processing such as a cyclic reduction check, which is used to determine frame errors. The number of information bits transmitted per second is less than the number of symbols per second. Therefore, the number of information bits will be less than M, which defines the number of symbols per frame.

The updated likelihoods of the symbols K M×1 vectors of likelihoods, $f_k'$, are fed-back through SAN 550 and processed by a bank of MMSE filters which are implemented on the M processor nodes, 560, 562, 564, 566. The K M×1 vectors of likelihoods, $f_k'$, prior to the SAN 550 are sent to the MMSE filters as M K×1 vectors of likelihoods, $b_m'$. However, now the bank of MMSE filters is used for amplitude estimation 575.

The same bank of 1-M symbol estimation processors 520, 522, 524, 526 used to implement the initial MMSE filters for symbol estimation can be used for the further MMSE filter implementation for amplitude estimation, illustrated by processing modules 560, 562, 564, 566. The MMSE processing modules 560, 562, 564, 566 in amplitude updating focus on the same observation intervals analyzed during the symbol estimation. The MMSE processors 560, 562, 564, 566 at this stage implement the functionality of the filter module 415, 420, 430 of FIG. 4. This bank of MMSE filters implemented by MMSE processors 560, 562, 564, 566 draw from local memory 552, 554, 556, 558 to retrieve prior amplitude estimates, updated symbol estimates, S-matrices, and the received data vector corresponding to the observation interval m.

Referring back to FIG. 4, each amplitude processing module 415, 420, 430 computes an amplitude update vector, $\Delta a_m$, which is K×1 vectors. Each amplitude update vector is passed to a central node that implements the functionality of the Amplitude Estimator 435. In FIG. 5, all individual update vectors from the amplitude estimation processors 560, 562, 564, 566 are passed to a central processing node 575 via the SAN 570. As detailed herein, the amplitude estimate is updated by weighting the sum of all amplitude updating vectors, wherein the weighting is based on quadratic terms reflecting the uncertainty in the update, $Q_m$. These quadratic terms are also passed to the central node 575 to provide the necessary weighting.

The SAN 570 passes all $\Delta a_m$ vectors (M vectors of size K×1) and $Q_m$ matrices, (M hermitian K×K matrices with K(K+1)/2 unique elements) from the MMSE processors 560, 562, 564, 566 to the central processing node, 575. The Amplitude Estimator 575 computes the functionality described for the Amplitude Estimator 435 of FIG. 4 and the updated estimate gets distributed to all M processors used for the next MMSE-based symbol estimation. Therefore, Amplitude Estimator 575 passes the updated amplitude estimate to SAN 580 that fan out these estimates for all K users to the M processors 520, 522, 524, 526 for the symbol estimation processing.

The updated amplitude estimates refreshes the amplitude estimates stored in the local memory 510, 512, 514, 516 coupled to the MMSE processors 520, 522, 524, 526. Following the receipt of the updated amplitude estimates, the next iteration of the MMSE-based symbol estimator is implemented. Therefore, the MMSE modules 510, 512, 514, 516 perform the symbol estimation processing and repeat the symbol estimation on the next iteration using the new amplitude estimates. As described herein, the iterative processing continues until estimates of the bit error rate metric achieves a certain level or until a fixed number of iterations have been executed.

The hardware configuration presented in FIG. 5 is an attractive implementation because bandwidth requirements are minimized by passing a total of only K·M floating point numbers over the SAN 530, except during amplitude updating when the matrices $Q_m$ are passed over the SAN 570 to a central node 575. Bandwidth can be further minimized during the amplitude testing by approximating $Q_m$ as a diagonal and therefore pass a total of 2K·M floating point numbers during amplitude updating. Since the MMSE operations, both symbol and amplitude, occur at the same processing nodes on processors, 520, 522, 524, 526 and 552, 554, 556, 558, less data is processed and efficient techniques can be used to exploit previous MMSE filter weights.

Figure 6:
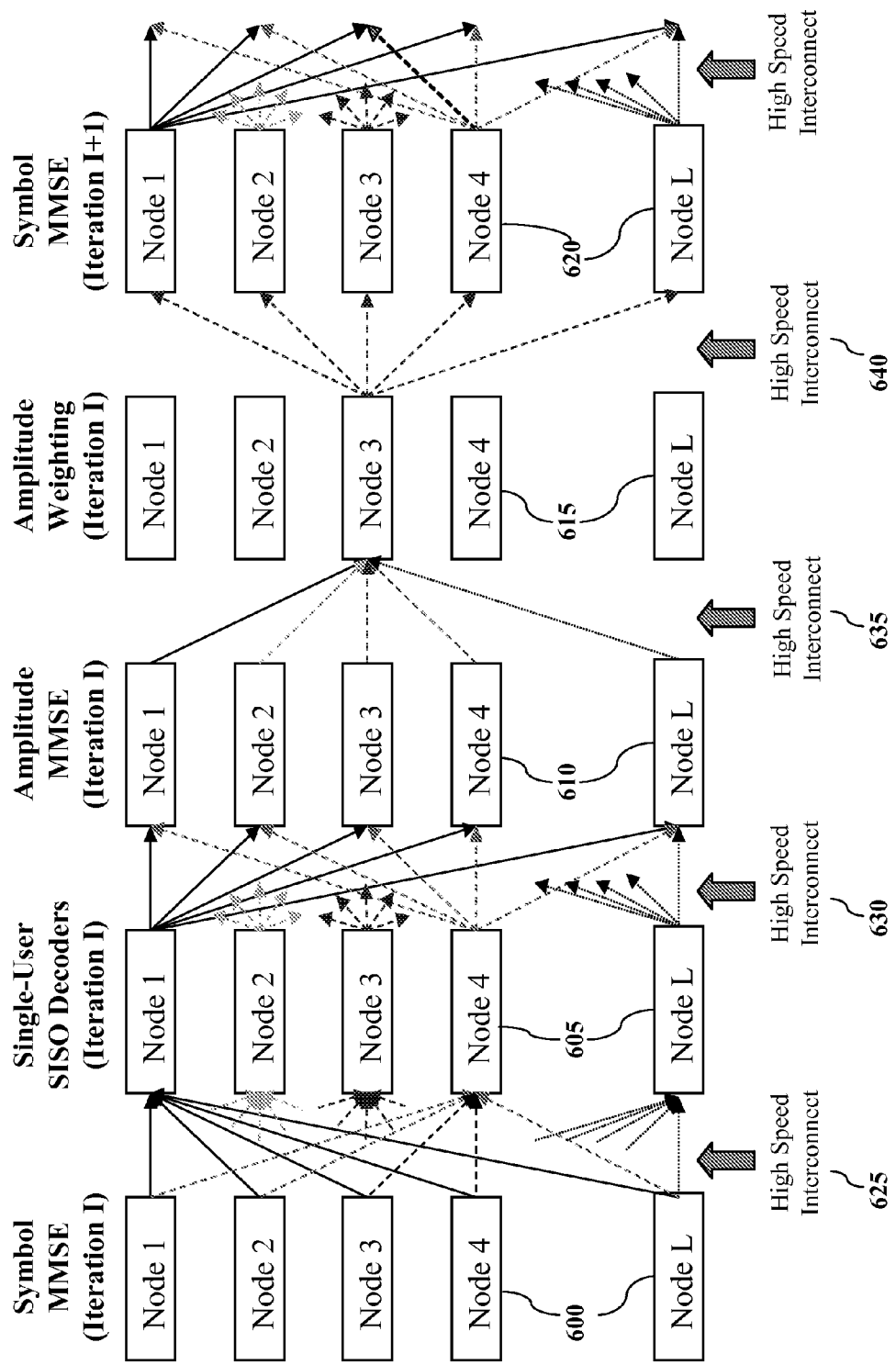
FIG. 6 is a schematic block diagram showing hardware conceptualization according to one embodiment of the present invention with nodes used to depict the processing.

The communications configuration described in FIG. 5, is more easily recognized in FIG. 6, which shows 1-L nodes responsible for all processing. These L nodes pass data between themselves using a high speed interconnect 625 for the system area network (SAN). The modules 600 correspond to the time when the nodes 1-L are used to implement the bank of M MMSE filters for symbol estimation in M observation intervals. The symbol estimation processing at node 600 is comparable to processing performed on MMSE processors 520, 522, 524, 526 shown in FIG. 5.

The number of L nodes depends upon the size of the problem, typically the number of K users, and the available hardware. For example, if K is small, then more than one MMSE filter operation can be performed per node in which case L<M. If K is large such that more than one node is required per MMSE filter operation, then L>M. The capability of the node is based on processing speed, local memory, design constraints, and concept of operation.

The data from symbol estimation processing nodes 600 is passed by the high speed interconnect 625 to the decoder processing nodes 605. The decoder processing nodes 605 are L nodes used to implement a bank of decoders such as SISO decoders, wherein the decoders for K users are distributed among the L nodes. This decoder processing corresponds to the bank of decoders 532, 534, 536, 538 of FIG. 5. While FIG. 6 illustrates an implementation using common hardware, for the implementation where the hardware for MMSE and decoders are different, the L nodes 605 could refer to dedicated decoder hardware.

The communication between nodes from the MMSE symbol estimation processing stage to the nodes for the decoding stage of the algorithm is illustrated by the following example. For illustrative purposes, let the number of nodes equal the number of observation intervals, L=M. This simplification is not an architecture restriction, but simply a convenient way to illustrate the communication between nodes. Based on this simplification, the output of each node 600 in the symbol estimation section is a K×1 vector representing symbol estimates for the K users. Each node 605 in the decoder section is responsible for decoding a subset of the number of users. To further simplify the discussion, let each node 605 in the decoder section execute two decoders. In other words, each node 605 performs the processing for two processors of the bank of decoders 532, 534, 536, 538 from FIG. 5 so that the number of nodes L in this example would be one half the number of users K (L=½K).

Therefore, based on these simplifications, for purposes of explanation only, the symbols from the symbol estimation nodes 600 that correspond to users 1 and 2 in the first observation interval are two of the K symbol estimates determined in Node 1. The symbols from Node 1 of the symbol estimation section 600 are transmitted to the Node 1 of the decoder section nodes 605, wherein Node 1 of the decoders nodes 605 represents the decoding of users 1 and 2 for the first time interval. The symbols for the users 1 and 2 in the second observation interval, Node 2, from the symbol estimations section 600 are passed over the high-speed interconnect 625 to Node 1 in the decoder section 605. Similarly, the symbols for the same two users, users 1 and 2, in the third observation interval, Node 3, from the symbol estimation section 600 are passed via 625 to Node 1 in the decoder section 605. This procedure continues for the M observation intervals for the symbols corresponding to the first 2 users, user 1 and user 2.

As should be readily apparent from this example, Node 2 of the decoder section 605 processes user 3 and user 4 for all the L observation nodes 600; Node 3 of the decoder section 605 processes user 5 and user 6 for all the L observation nodes. By way of further explanation, Node 4 in the decoder section 605 is responsible for decoding users 7 and 8, and receives two symbols corresponding to users 7 and 8 from all the L observation nodes 600. For example, Node 1 of the symbol estimation section 600 passes the symbol estimates of users 7 and 8 to Node 4 of decoder section 605. Similarly, Node 2 of the symbol estimation section 600 passes the symbol estimates for users 7 and 8 for the 2nd observation interval to Node 4 of decoder section 605. This procedure continues for all L nodes in the decoder section 605. Therefore, symbol estimates out of the MMSE symbol estimators 600 are routed from the M observation intervals to the K decoders of the decoder section 605 based on the mapping of the K decoders to the L available processing nodes.

The next section is the amplitude estimation section 610 for nodes 1-L. The amplitude estimation section 610 represents L nodes implementing the MMSE stage of the amplitude estimator, as shown by modules 560, 562, 564, 566 in FIG. 5. Prior to implementing amplitude estimation, the amplitude estimation nodes 610 receives all symbol likelihoods via the high speed interconnect 630 following the execution of the nodes from the decoders 605. As described in FIG. 5, the likelihoods of the symbols out of the K decoders 532, 534, 536, 538 are routed back to M MMSE filters 560, 562, 564, 566 for the amplitude estimation stage of the algorithm. For this example, two decoders are implemented per node in the decoder section 605 and one MMSE filter processor in the amplitude estimation section 610 is executed per node. The output of Node 1 in the decoder section is a M×2 array of likelihoods corresponding to the M symbol likelihoods for the first two users after implementing the decoder processing 605, descrambler, de-interleaver, and rate identification. Node 1 in the amplitude estimation section 610 retains the symbol likelihoods for the first two users, user 1 and user 2, in the first observation interval. Node 2 in the amplitude estimation section 610 is responsible for the MMSE implementation over the second observation interval. Therefore, the second set of bits in the M×2 array is passed from Node 1 in the decoder section 605 to Node 2 in the amplitude estimation section 610. This is repeated for all M observation intervals. Therefore, the outputs of the decoder section 605 are passed to all nodes 610 computing the amplitude updating vector in the M observation intervals.

The next set of nodes is the amplitude weighing section 615 responsible for updating the amplitude estimate and which implements the functionality of the amplitude estimator 575 of FIG. 5. This processing is performed at a single node, and for illustrative purposes Node 3 is depicted and described herein. It should be noted that the other nodes of this section 615 of the algorithm remain idle while the amplitude estimation is completed. Therefore the high-speed interconnect 635 passes the amplitude updating vector and quadratics from the L nodes in the amplitude estimation section 610 Node 3 of the amplitude weighing section 615.

The functionality of the Amplitude Estimator 435 of FIG. 4 provides a more detailed explanation concerning the weighing implementation. The amplitude estimate calculated by Node 3 of the amplitude weighing section 615 is "fanned-out" to all the L processing nodes for further processing of symbol estimation at the next iteration (I+1). Thus, the new amplitude estimate for all K users is distributed via the high speed interconnect 640 to all the L nodes of the next iteration symbol estimation section 620 for the I+1 iteration. The L nodes in the next iteration symbol estimation section 620 re-compute the symbol estimates, using the new amplitude estimates, for the K users in the M observation intervals. The stages and data routing are repeated until the maximum number of iterations is achieved or the desired bit error rate is reached.

One aspect of the present invention is that it solves the previously described problem of tightly integrating parameter estimation, symbol hypothesis testing, decoding, and rate identification. The approach in one embodiment assumes a modulation scheme (e.g. CDMA) has been utilized. The solution presented herein in one embodiment is a windowed-based Minimum Mean Squared Error (MMSE) approach to Turbo-decoding for joint signal demodulation, which is easily extended to time-varying channels. The invention is based on an iterative decoding solution that exploits error correction codes. In addition, the approach of the present invention is suitable for symbol asynchronous as well as symbol synchronous. Also, the algorithm used is suitable for a variety of signaling schemes such as M-ary Phase Shift Keying (MPSK).

It will be appreciated that implementation of the present invention solves the problem of the unknown channel parameters in state of the art detectors. The present invention works with many varieties of multiuser detectors and is easily implemented into different multiuser detecting systems. Specifically, the MMSE symbol estimators in modules 600 and 620 of FIG. 6 can be substituted with any of the known or referenced MUD algorithms.

The present invention dramatically reduces the number of computations needed in a blind approach to joint signal demodulation and without pilot tones or training sequences, so that reliable operation can be achieved in a real-time implementation. It will also be appreciated that since the present technique does not require knowledge of training sequences or existence of a pilot signal, it is considered a blind approach to symbol and data rate estimation. The efficient implementation of blind estimation is realized because of the high degree of parallelism. This provides an efficient implementation because of reduced number of operations associated with updating MMSE filter tap weights.

Further efficiency is realized because the number of iterations required to achieve a certain bit-error-rate for case of unknown amplitudes is typically similar to the case when the amplitudes are completely known. The present efficiency occurs because the degradation in bit-error-rate for the case of unknown amplitudes is manageable relative to the case of known amplitudes. Thus, the present approach represents a new method to estimate channel amplitudes and extension to time-varying channels is obvious to those in the art. The present approach also represents a new method to reduce biases in amplitude estimates based on incoherent integration.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A joint amplitude estimator for a data stream from multiple users, comprising:
   a data stream from said multiple users divided into a plurality of observation intervals;
   a plurality of processing modules coupled to said observation intervals, wherein said processing modules calculates interference cancellation values for each of said users and computes a filter for each of said observation intervals, said filter being applied to said data within said observation interval to compute individual amplitude estimates; and
   an amplitude estimation unit which processes said individual amplitude estimates and calculates new amplitude estimates, wherein said new amplitude estimates are iteratively passed back to said processing modules either a maximum number of iterations or a desired bit error rate have been reached.

2. The joint amplitude estimator according to claim 1, wherein said final condition is selected from at least one of the group consisting of: bit error rate metric level and fixed number of iterations.

3. The joint amplitude estimator according to claim 1, wherein said amplitude estimation unit sums and weighs said individual estimates.

4. The joint amplitude estimator according to claim 1, wherein said observation intervals are based on distinguishing attributes selected from at least one of the group consisting of: time, code, and frequency.

5. The joint amplitude estimator according to claim 1, wherein said filter is calculated for an arbitrary observation interval m as:

$$G_m = B_m S_m^H (S_m \chi_m S_m^H + \sigma_n^2 I)^{-1}$$

wherein $G_m$ is a MMSE filter, $B_m$ is a diagonal matrix representing the expected bit or symbol value, $S_m$ is an S matrix defined over a single observation interval, I is an identity matrix and m is an arbitrary observation interval.

6. A method for processing amplitude estimates for a multiuser data stream divided into a plurality of observation intervals, comprising:
   computing a filter for each said observation interval of said data stream;
   applying interference cancellation to said data stream for each said observation interval;
   applying said filter to said data stream for each said observation interval from said interference cancellation to produce individual amplitude estimates for each said observation interval;
   computing new amplitude estimates using said individual amplitude estimates; and
   passing said new amplitude estimates back to said filter for iterative processing until either a maximum number of iterations or a desired bit error rate have been reached.

7. The method according to claim 6, wherein said computing further comprises summing said individual amplitude estimates and weighing.

8. The method according to claim 6, wherein said final condition is selected from at least from the group consisting of: bit error rate metric level and fixed number of iterations.

* * * * *